(12) United States Patent
Cheng et al.

(10) Patent No.: US 9,484,227 B1
(45) Date of Patent: Nov. 1, 2016

(54) DICING IN WAFER LEVEL PACKAGE

(71) Applicant: Taiwan Semiconductor Manufacturing Company, Ltd., Hsin-Chu (TW)

(72) Inventors: Chia-Shen Cheng, Hsin-Chu (TW); An-Jhih Su, Bade (TW); Chung-Shi Liu, Hsin-Chu (TW); Hsiu-Jen Lin, Zhubei (TW); Hsien-Wei Chen, Hsin-Chu (TW); Ming-Da Cheng, Jhubei (TW); Wei-Yu Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/745,623

(22) Filed: Jun. 22, 2015

(51) Int. Cl.
| | |
|---|---|
| H01L 21/44 | (2006.01) |
| H01L 21/56 | (2006.01) |
| H01L 21/78 | (2006.01) |
| H01L 23/31 | (2006.01) |
| H01L 23/29 | (2006.01) |
| H01L 21/683 | (2006.01) |

(52) U.S. Cl.
CPC .......... *H01L 21/561* (2013.01); *H01L 21/568* (2013.01); *H01L 21/6835* (2013.01); *H01L 21/78* (2013.01); *H01L 23/293* (2013.01); *H01L 23/3114* (2013.01); *H01L 2221/68327* (2013.01)

(58) Field of Classification Search
CPC . H01L 21/78; H01L 21/568; H01L 21/6835; H01L 23/293; H01L 23/3114
USPC .................................... 438/33, 113; 257/787
See application file for complete search history.

(56) References Cited

U.S. PATENT DOCUMENTS

| | | | |
|---|---|---|---|
| 6,562,647 B2 * | 5/2003 | Zandman | H01L 21/76898 257/E21.597 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2001/0016369 A1 * | 8/2001 | Zandman | H01L 21/76898 438/106 |
| 2004/0113283 A1 * | 6/2004 | Farnworth | H01L 21/3043 257/782 |
| 2008/0116544 A1 * | 5/2008 | Grinman | H01L 23/3114 257/659 |
| 2008/0128904 A1 * | 6/2008 | Sakamoto | H01L 21/563 257/737 |
| 2011/0291288 A1 | 12/2011 | Wu et al. | |
| 2013/0026468 A1 | 1/2013 | Yoshimuta et al. | |
| 2013/0049195 A1 * | 2/2013 | Wu | H01L 24/97 257/738 |
| 2013/0062760 A1 | 3/2013 | Hung et al. | |
| 2013/0062761 A1 | 3/2013 | Lin et al. | |

(Continued)

*Primary Examiner* — Nitin Parekh
(74) *Attorney, Agent, or Firm* — Slater Matsil, LLP

(57) ABSTRACT

A method includes placing a first device die and a second device die over a carrier, with a scribe line between the first device die and the second device die. The first device die and the second device die are encapsulated with an encapsulating material, which has a portion in the scribe line. The method further includes forming a dielectric layer over the encapsulating material, performing a first die-saw to form a first trench in the scribe line, performing a second die-saw to form a second trench in the scribe line, and performing a third die-saw on the scribe line to separate the first device die from the second device die.

20 Claims, 26 Drawing Sheets

(56) References Cited

U.S. PATENT DOCUMENTS

| | | |
|---|---|---|
| 2013/0168848 A1 | 7/2013 | Lin et al. |
| 2013/0187258 A1* | 7/2013 | Lu ........................ H01L 23/3135 257/621 |
| 2013/0307140 A1 | 11/2013 | Huang et al. |
| 2013/0341800 A1* | 12/2013 | Tu ........................... H01L 21/78 257/774 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0214077 A1* | 7/2015 | Tsai ........................ H01L 21/78 257/737 |
| 2015/0357256 A1* | 12/2015 | Suthiwongsunthorn ............ H01L 21/6836 257/734 |
| 2016/0172306 A1* | 6/2016 | Scanlan ................ H01L 23/544 438/462 |

* cited by examiner

DICING IN WAFER LEVEL PACKAGE

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
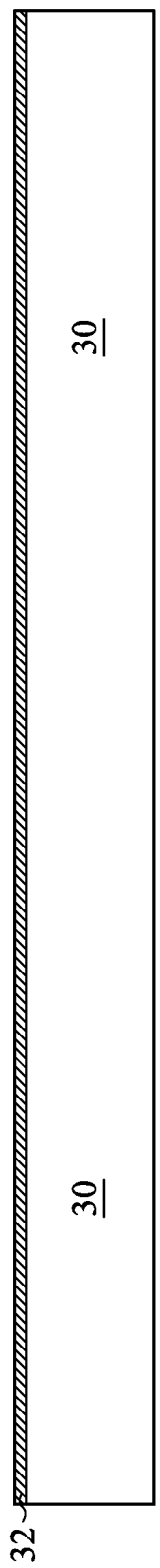
FIGS. 1 through 21B illustrate the cross-sectional views and top views of intermediate stages in the formation of a fan-out Package-on-Package (PoP) package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 23:
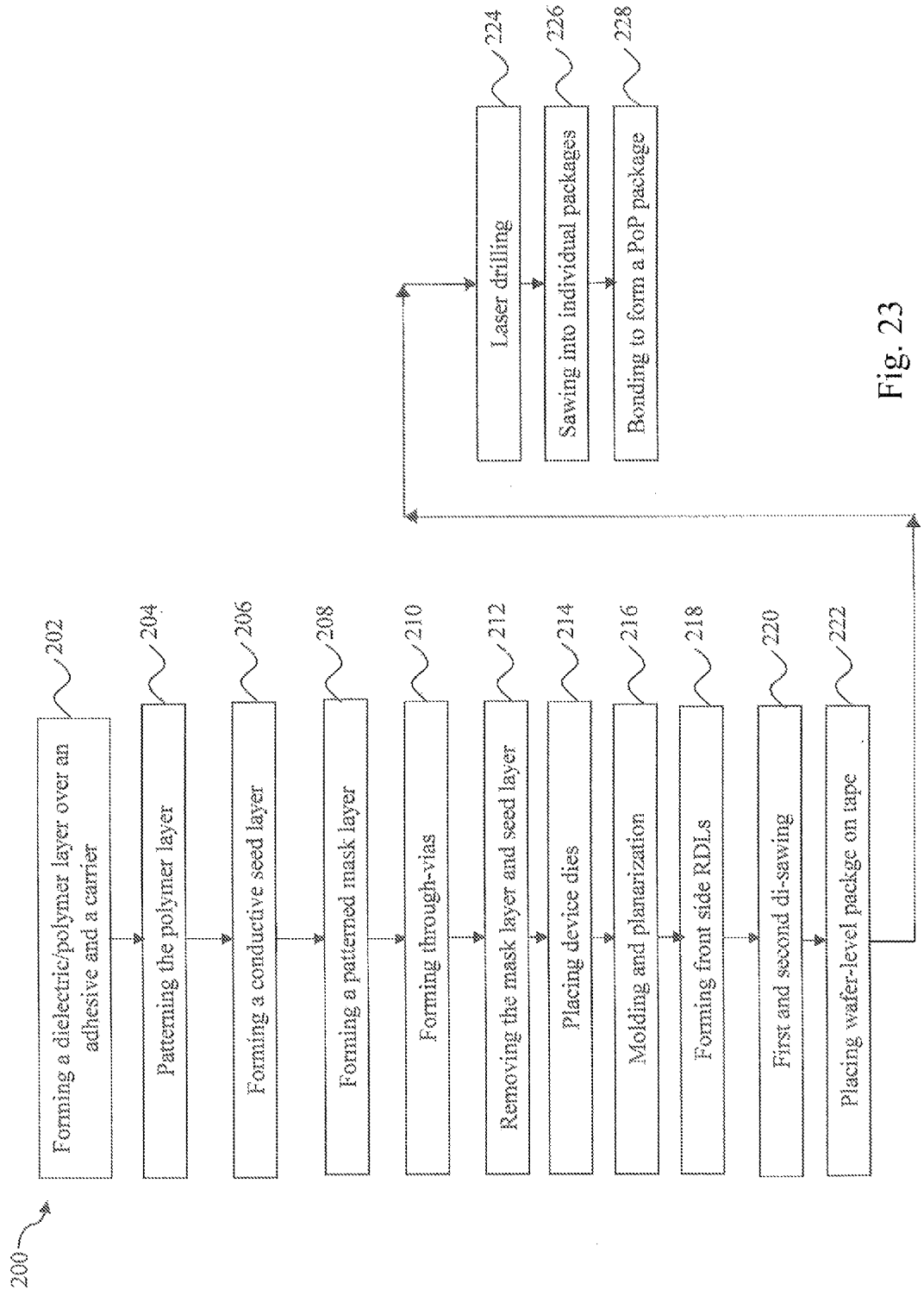
FIG. 23 illustrates a process flow for forming a PoP package in accordance with some embodiments.

A fan-out Package-on-Package (PoP) structure/package and the method of forming the package are provided in accordance with various exemplary embodiments. Some variations of the embodiments are discussed. Throughout the various views and illustrative embodiments, like reference numbers are used to designate like elements. FIGS. 1 through 21B illustrate the cross-sectional views of intermediate stages in the formation packages in accordance with some embodiments. The steps shown in FIG. 1 through 21B are also illustrated schematically in the process flow 200 shown in FIG. 23. In the subsequent discussion, the process steps shown in FIGS. 1 through 21B are discussed referring to the process steps in FIG. 23.

Referring to FIG. 1, carrier 30 is provided, and adhesive layer 32 is disposed over carrier 30. Carrier 30 may be a blank glass carrier, a blank ceramic carrier, or the like, and may have a shape of a semiconductor wafer with a round top-view shape. Carrier 30 is sometimes referred to as a carrier wafer. Adhesive layer 32 may be formed of a Light-to-Heat Conversion (LTHC) material, for example, although other types of adhesives may be used. In accordance with some embodiments of the present disclosure, adhesive layer 32 is capable of decomposing under the heat of light, and hence can release carrier 30 from the structure formed thereon.

Figure 2:
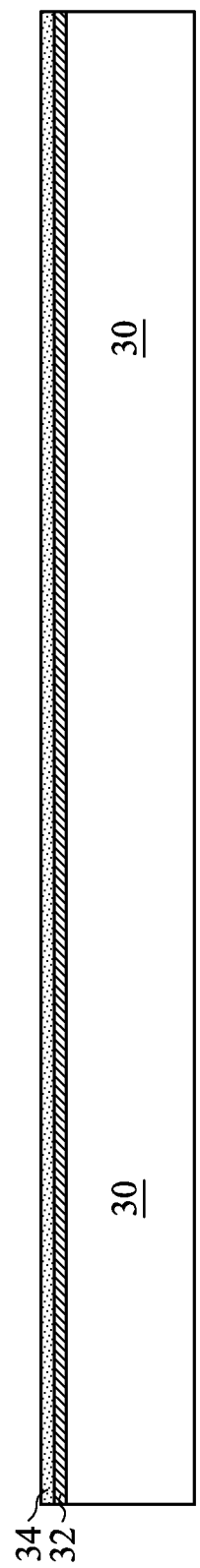

Referring to FIG. 2, dielectric layer 34 is formed over adhesive layer 32. The respective step is shown as step 202 in the process flow shown in FIG. 23. In accordance with some embodiments of the present disclosure, dielectric layer 34 is a polymer layer formed of a polymer, which may be a photo-sensitive polymer such as polybenzoxazole (PBO), polyimide, or the like. In accordance with some embodiments, dielectric layer 34 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 3:
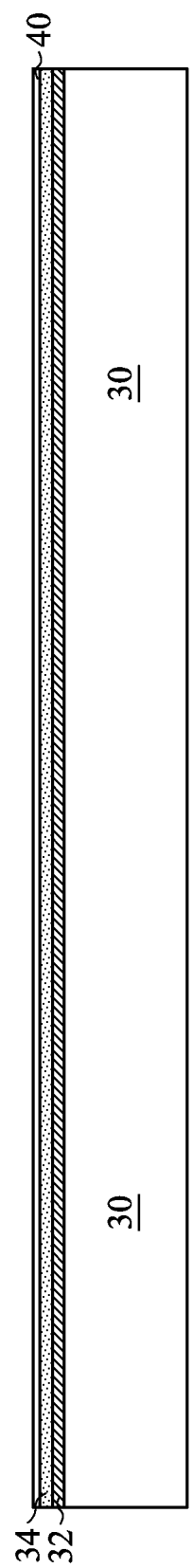

Referring to FIG. 3, conductive seed layer 40 is formed over dielectric layer 34, for example, through Physical Vapor Deposition (PVD). The respective step is shown as step 206 in the process flow shown in FIG. 23. Conductive seed layer 40 may be a metal seed layer including copper, aluminum, titanium, alloys thereof, or multi-layers thereof. In accordance with some embodiments of the present disclosure, conductive seed layer 40 includes a first metal layer such as a titanium layer (not shown) and a second metal layer such as a copper layer (not shown) over the first metal layer. In accordance with alternative embodiments of the present disclosure, conductive seed layer 40 includes a single metal layer such as a copper layer, which may be formed of substantially pure copper or a copper alloy.

Figure 4:
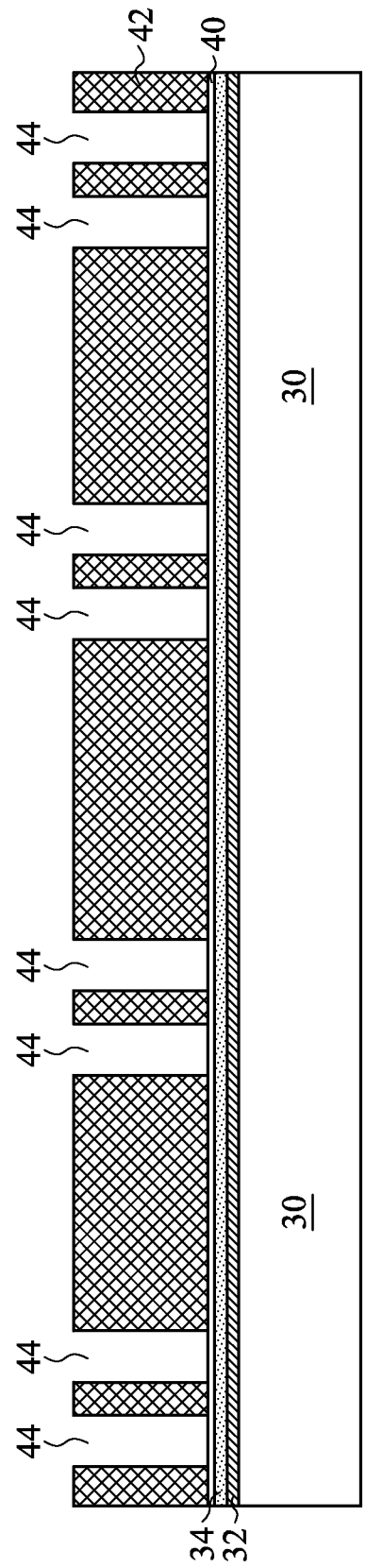

FIGS. 4 through 7 illustrate the formation of through-vias. As shown in FIG. 4, patterned mask layer 42 (such as a photo resist) is applied over conductive seed layer 40, and is then patterned using a photo lithography mask. The respective step is shown as step 208 in the process flow shown in FIG. 23. In accordance with some embodiments of the present disclosure, photo resist 42 is a dry film, which is laminated onto conductive seed layer 40. In accordance with alternative embodiments, photo resist 42 is formed by spin coating. As a result of the patterning (exposure and development), openings 44 are formed in photo resist 42, through which some portions of conductive seed layer 40 are exposed. The thickness of photo resist 42 is determined by the thickness of the subsequently placed device die 48 (FIG. 8). In accordance with some embodiments of the present disclosure, the thickness of photo resist 42 is greater than the thickness of device die 48.

Figure 5:
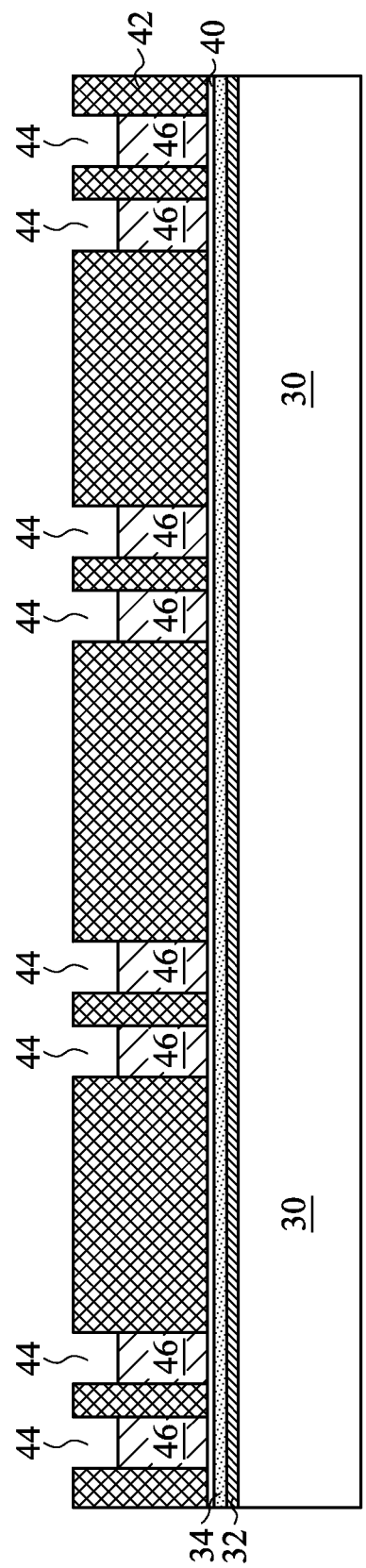

As shown in FIG. 5, through-vias 46 are formed in openings 44 through plating, which may be electro plating or electro-less plating. The respective step is shown as step 210 in the process flow shown in FIG. 23. Through-vias 46 are plated on the exposed portions of conductive seed layer 40. Through-vias 46 are conductive, and may be metal vias including copper, aluminum, tungsten, nickel, or alloys thereof. The top-view shapes of through-vias 46 include, and are not limited to, rectangles, squares, circles, and the like. The heights of through-vias 46 are determined by the thickness of the subsequently placed device dies 48 (FIG. 8), with the heights of through-vias 46 slightly greater than or equal to the thickness of device die 48 in accordance with some embodiments of the present disclosure.

Figure 6:
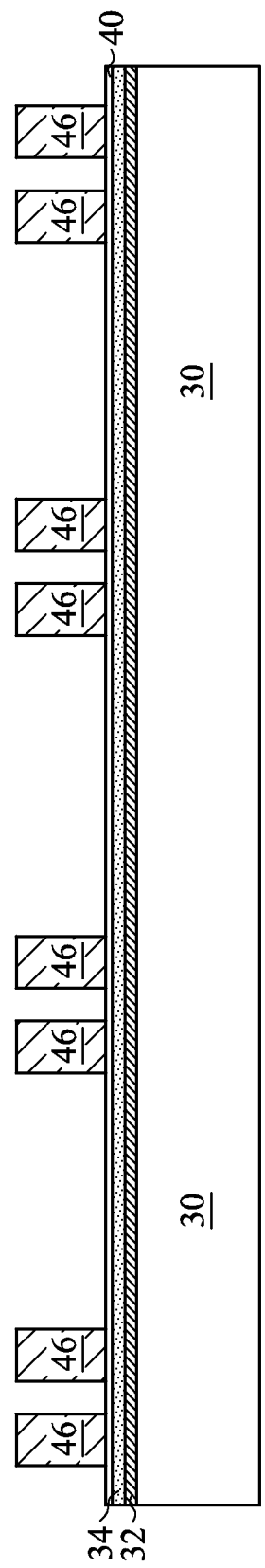

After the plating of through-vias 46, photo resist 42 is removed, and the resulting structure is shown in FIG. 6. The respective step is shown as step 212 in the process flow shown in FIG. 23. As a result, the portions of conductive seed layer 40 that are previously covered by photo resist 42 are exposed.

Figure 7:
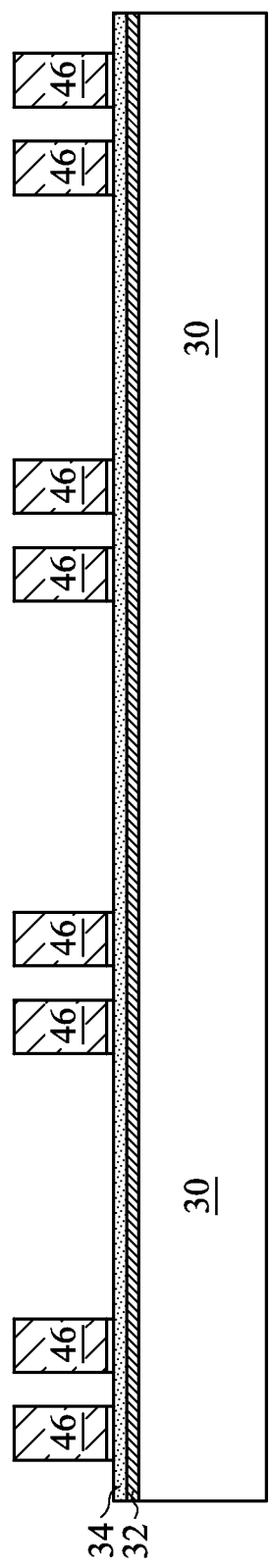
Figure 8:
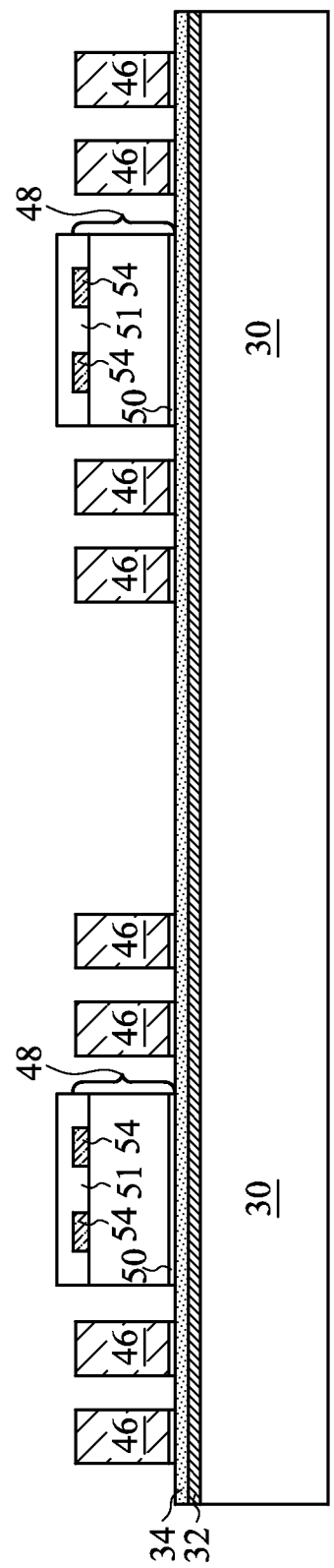

Next, as shown in FIG. 7, an etching step is performed to remove the exposed portions of conductive seed layer 40, wherein the etching may be an anisotropic or isotropic etching. The respective step is also shown as step 212 in the process flow shown in FIG. 23. The portions of conductive seed layer 40 that are overlapped by through-vias 46, on the other hand, remain not etched. Throughout the description, the remaining underlying portions of conductive seed layer 40 are referred to as the bottom portions of through-vias 46. Although conductive seed layer 40 is shown as having distinguishable interfaces with the overlying portions of through-vias 46, when conductive seed layer 40 is formed of a material similar to or the same as that of the respective overlying through-vias 46, some or all of conductive seed layer 40 may be merged with through-vias 46 with no distinguishable interface therebetween. For example, the copper layer in conductive seed layer 40 may be merged with through-vias 46 with no distinguishable interfaces. In accordance with alternative embodiments, there exist distinguishable interfaces between conductive seed layer 40 and the respective overlying plated portions of through-vias 46. For example, the titanium layer in conductive seed layer 40 may be distinguishable from the copper-containing through-vias 46. As a result of the etching of conductive seed layer 40, dielectric layer 34 is exposed.

FIG. 8 illustrates the placement of device dies 48 over dielectric layer 34. The respective step is shown as step 214 in the process flow shown in FIG. 23. Device dies 48 may be adhered to adhesive layer 32 through die attach films 50. The edges of die attach films 50 are co-terminus with (aligned to) edges of the respective device dies 48. Die attach films 50 are adhesive films. The plurality of placed device dies 48 may be arranged as an array including a plurality of rows and a plurality of columns. Each of device die 48 may include a semiconductor substrate having a back surface (the surface facing down) in physical contact with the respective underlying die attach films 50. Device dies 48 further include integrated circuit devices (such as active devices, which include transistors, for example, not shown) at the front surface (the surface facing up) of the semiconductor substrates. Device dies 48 may include logic dies such as Central Processing Unit (CPU) dies, Graphic Processing Unit (GPU) dies, mobile application dies, or the like.

Device dies 48 may include metal pillars 54 at their top surfaces. Metal pillars 54 are electrically coupled to the integrated circuits inside device dies 48. In accordance with some exemplary embodiments of the present disclosure, as shown in FIG. 8, metal pillars 54 are covered by dielectric layers 51, with the top surfaces of dielectric layer 51 being higher than the top surfaces of metal pillars 54. Dielectric layers 51 further extend into the gaps between metal pillars 54. In accordance with some embodiments of the present disclosure, the top surfaces of metal pillars 54 are coplanar with the top surface of the respective dielectric layer 51. Dielectric layers 51 may be formed of a polymer such as PBO in accordance with some exemplary embodiments. Metal pillars 54 may be copper pillars, and may also include other conductive/metallic materials such as aluminum, nickel, or the like.

Figure 9:
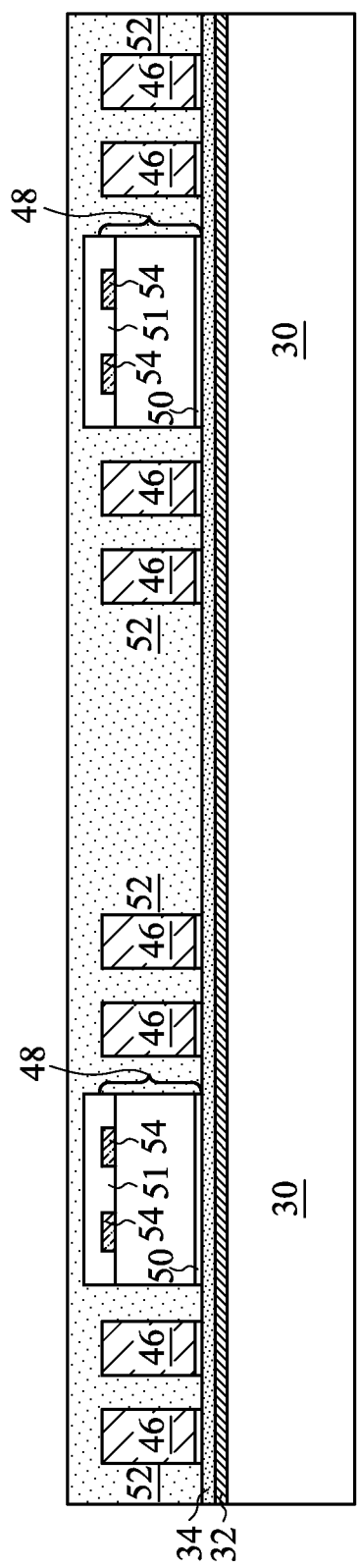

Referring to FIG. 9, encapsulating material 52 is encapsulated/molded on device dies 48 and through-vias 46. The respective step is shown as step 216 in the process flow shown in FIG. 23. Encapsulating material 52 fills the gaps between device dies 48 and through-vias 46, and may be in contact with dielectric layer 34. Encapsulating material 52 may include a molding compound, a molding underfill, an epoxy, or a resin. After the encapsulating process, the top surface of encapsulating material 52 is higher than the top ends of metal pillars 54 and through-vias 46.

Figure 10:
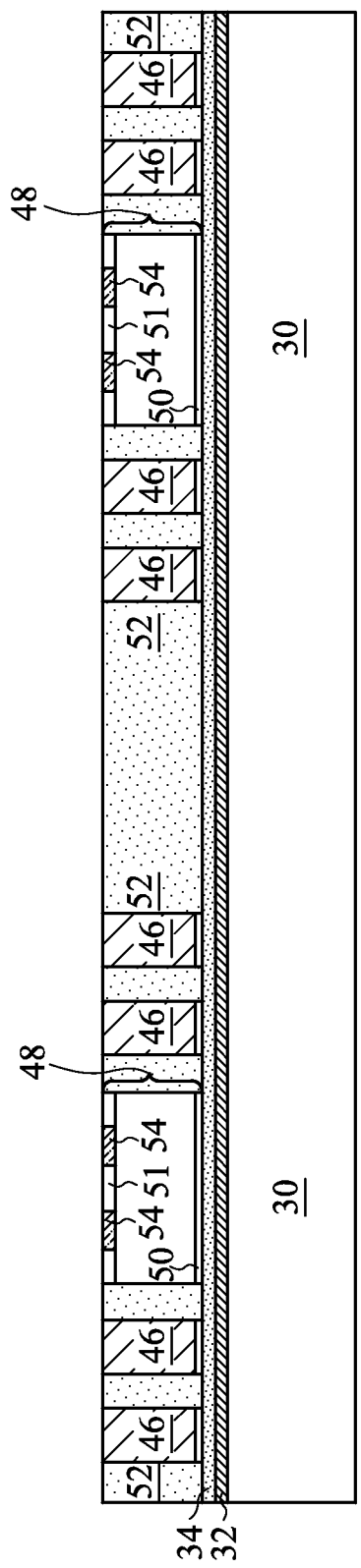

Next, a planarization step such as a Chemical Mechanical Polish (CMP) step or a grinding step is performed to planarize encapsulating material 52, until through-vias 46 are exposed. The respective step is also shown as step 216 in the process flow shown in FIG. 23. The resulting structure is shown in FIG. 10. Metal pillars 54 of device dies 48 are also exposed as a result of the planarization. Due to the planarization, the top surfaces of through-vias 46 are substantially level (coplanar) with the top surfaces of metal pillars 54, and are substantially level (coplanar) with the top surface of encapsulating material 52.

Figure 11:
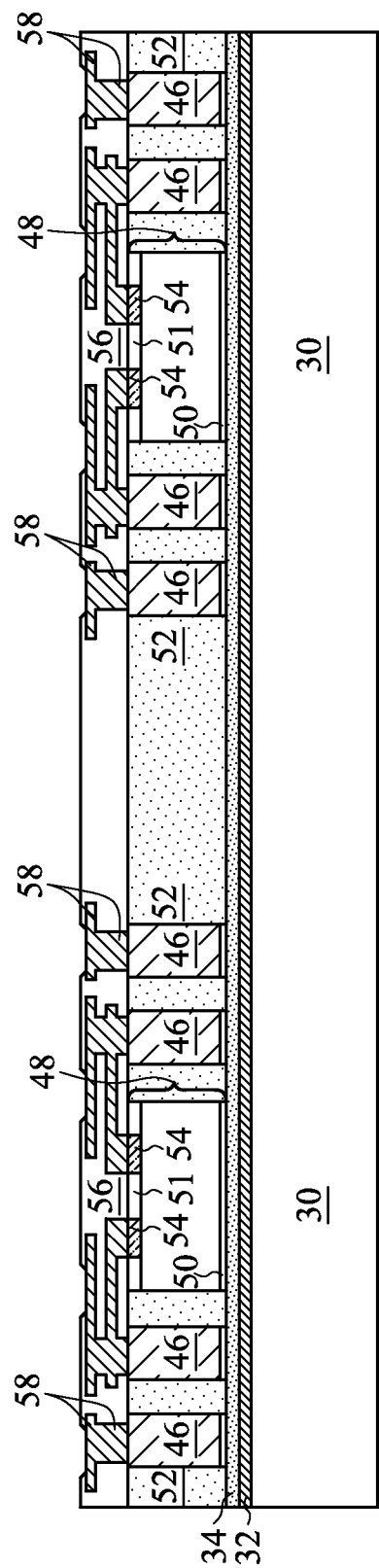

Referring to FIG. 11, one or more layers of dielectric layers 56 and the respective Redistribution Lines (RDLs) 58 are formed over encapsulating material 52, through-vias 46, and metal pillars 54. The respective step is shown as step 218 in the process flow shown in FIG. 23. RDLs 58 are referred to as front side RDLs since they are on the front side of device dies 48. In accordance with some embodiments of the present disclosure, dielectric layers 56 are formed of a polymer(s) such as PBO, polyimide, or the like. In accordance with alternative embodiments of the present disclosure, dielectric layers 56 are formed of an inorganic dielectric material(s) such as silicon nitride, silicon oxide, silicon oxynitride, or the like.

RDLs 58 are formed to electrically couple to metal pillars 54 and through-vias 46. RDLs 58 may also interconnect metal pillars 54 and through-vias 46 with each other. RDLs 58 may include metal traces (metal lines) and vias underlying and connected to the metal traces. In accordance with some embodiments of the present disclosure, RDLs 58 are formed through plating processes, wherein each of RDLs 58 includes a seed layer (not shown) and a plated metallic material over the seed layer. The seed layer and the plated metallic material may be formed of the same material or different materials.

Figure 12:
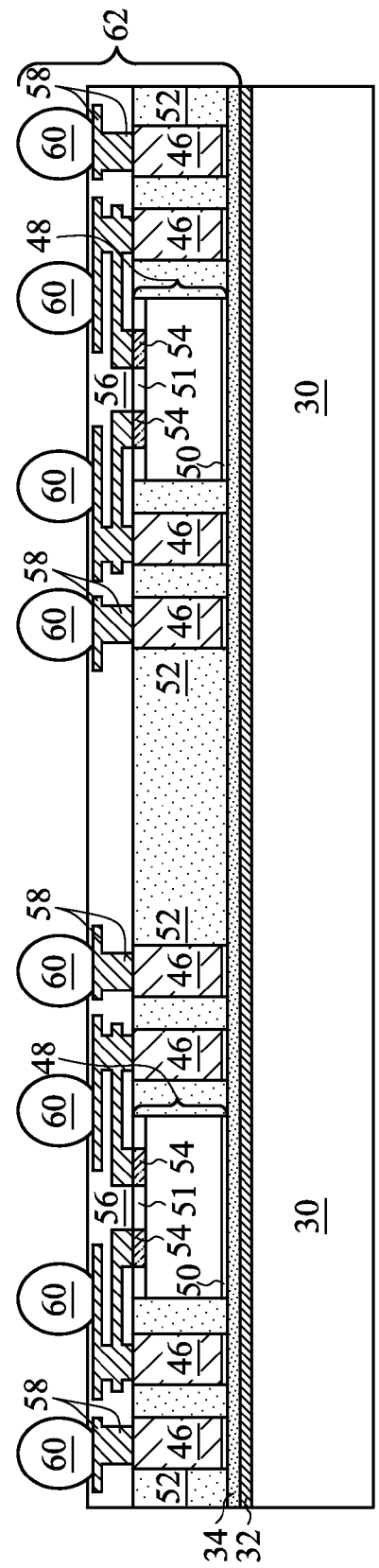

FIG. 12 illustrates the formation of electrical connectors 60 in accordance with some exemplary embodiments of the present disclosure. Electrical connectors 60 are electrically coupled to RDLs 58, metal pillars 54, and/or through-vias 46. The formation of electrical connectors 60 may include placing solder balls over RDLs 58 and then reflowing the solder balls. In accordance with alternative embodiments of the present disclosure, the formation of electrical connectors 60 includes performing a plating step to form solder regions over RDLs 58 and then reflowing the solder regions. Electrical connectors 60 may also include metal pillars, or metal pillars and solder caps, which may also be formed through plating. Throughout the description, the combined structure including device dies 48, through-vias 46, encapsulating material 52, RDLs 58, and dielectric layers 56 will be referred to as wafer-level package 62, which is a composite wafer including a plurality of device dies 48.

FIG. 12 illustrates two RDL layers 58. In accordance with alternative embodiments, there may be a single layer of RDLs 58 or more than two layers of RDLs 58, depending on the routing requirement of the respective package. In accordance with yet alternative embodiments of the present disclosure, there are no RDLs, and electrically connectors 60 are formed directly over through-vias 46 and metal pillars 54, with no RDLs formed between connectors 60 and the underlying through-vias 46 as well as metal pillars 54.

Figure 13:
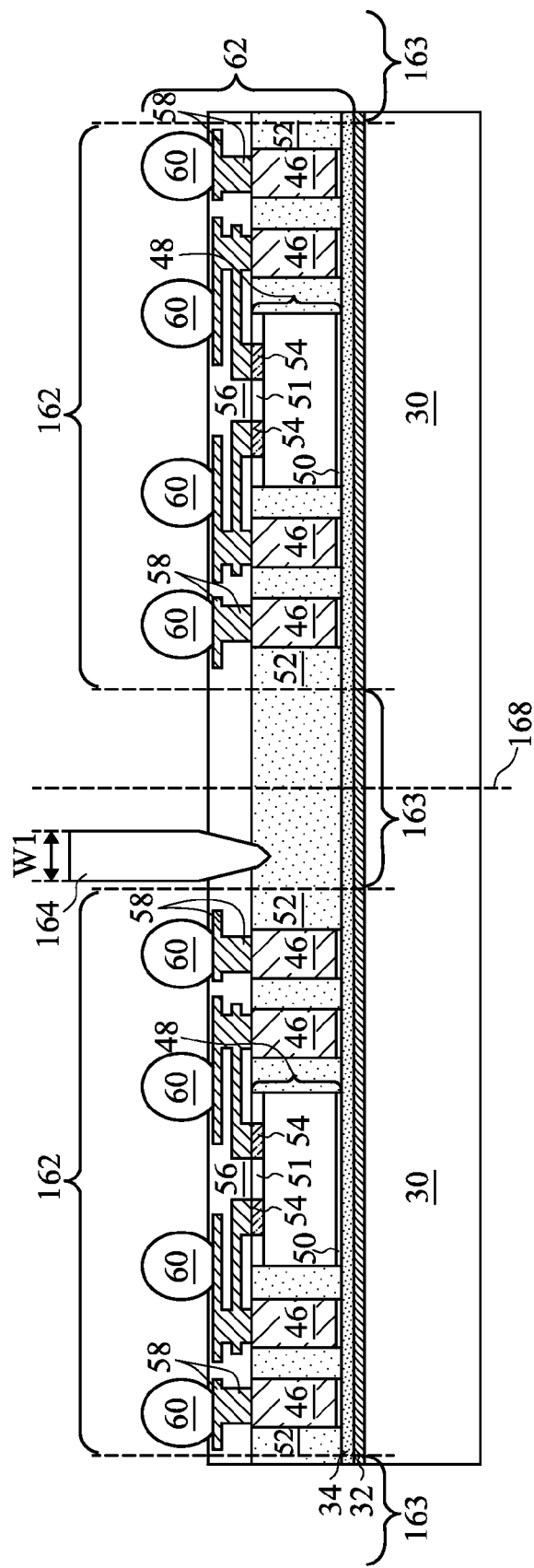

Referring to FIG. 13, wafer-level package 62 includes a plurality of packages 162, each including one or more device die 48 and a plurality of through-vias 46. Packages 162 are spaced apart from each other, with the spaces (and the materials filling the spaces) between neighboring packages 162 being referred to as scribe lines 163. FIG. 15B illustrates a top view of wafer-level package 62, wherein packages 162 are arranged as an array including a plurality of rows and columns, with first scribe lines 163 extending in the X direction, and second scribe lines 163 extending in the Y direction.

Figure 14:
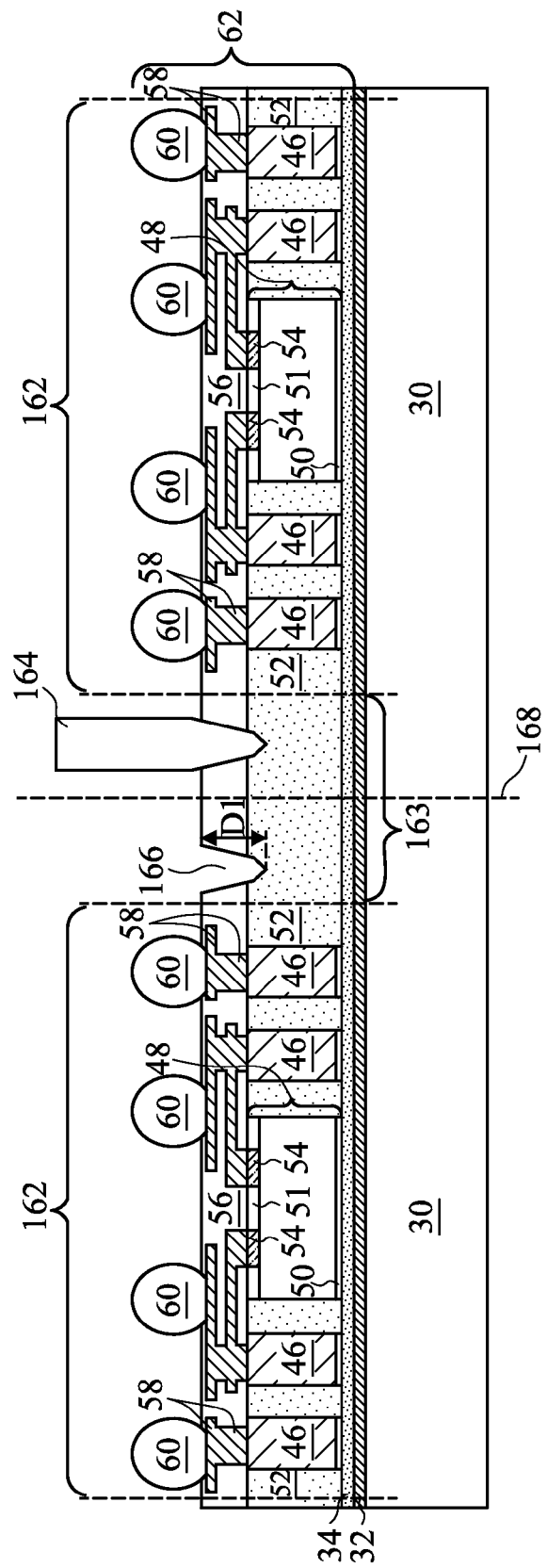

Referring back to FIG. 13, a first die-saw is performed. In accordance with some embodiments of the present disclosure, the first die-saw is performed using blade 164, which is rotated during the die-saw. The respective step is shown as step 220 in the process flow shown in FIG. 23. In accordance with alternative embodiments of the present disclosure, the first die-saw is performed using laser. The width W1 of blade 164 is relatively smaller. For example, width W1 may be in the range between about 35 μm and about 50 μm. The relatively thin blade 164 has the advantageous feature of reducing the peeling of dielectric layers 56 in the die-saw, wherein the peeling is likely to occur between the interface between dielectric layers 56 and encapsulating material 52. The first die-saw results in dielectric layers 56, which are located over encapsulating material 52, to be sawed through. Furthermore, the first die-saw stops at an intermediate level of encapsulating material 52. The first die-saw results in trench 166 to be generated, as shown in FIG. 14. Depth D1 of the resulting trench 166 (FIG. 14) may be in the range between about 30 μm and about 80 μm.

Scribe line 163 has middle line 168 that has equal distances to the packages 162 on its opposite sides. Trench 166 may be on one side of middle line 168, and does not extend to middle line 168 in accordance with some exemplary embodiments of the present disclosure.

Figure 15A:
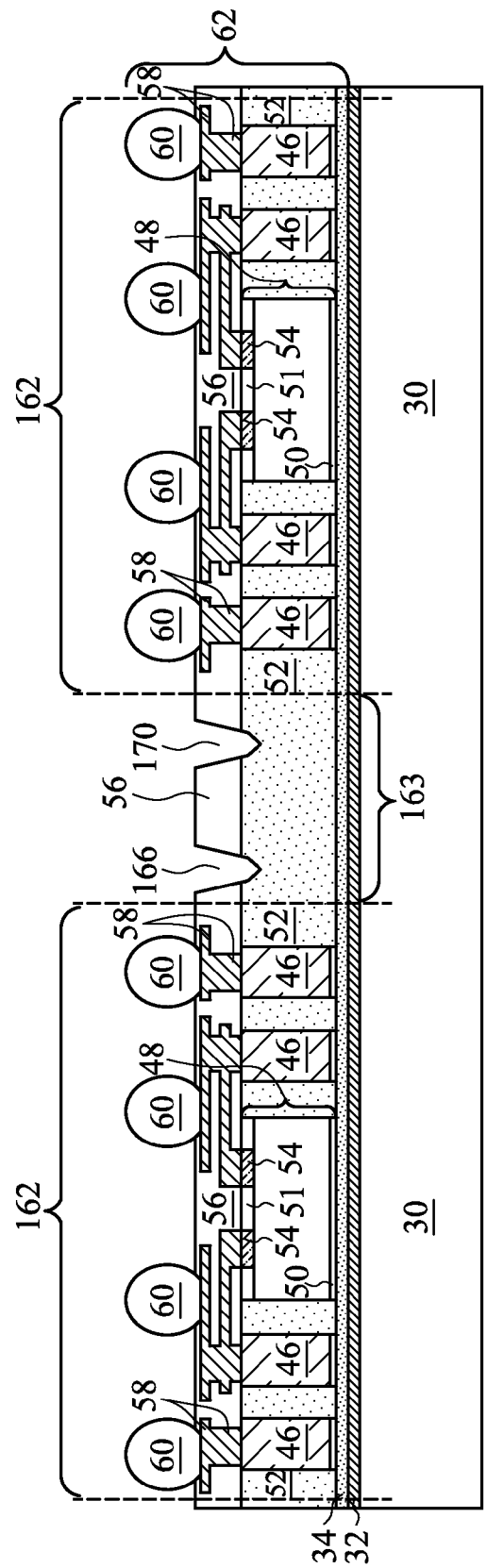
Figure 15B:
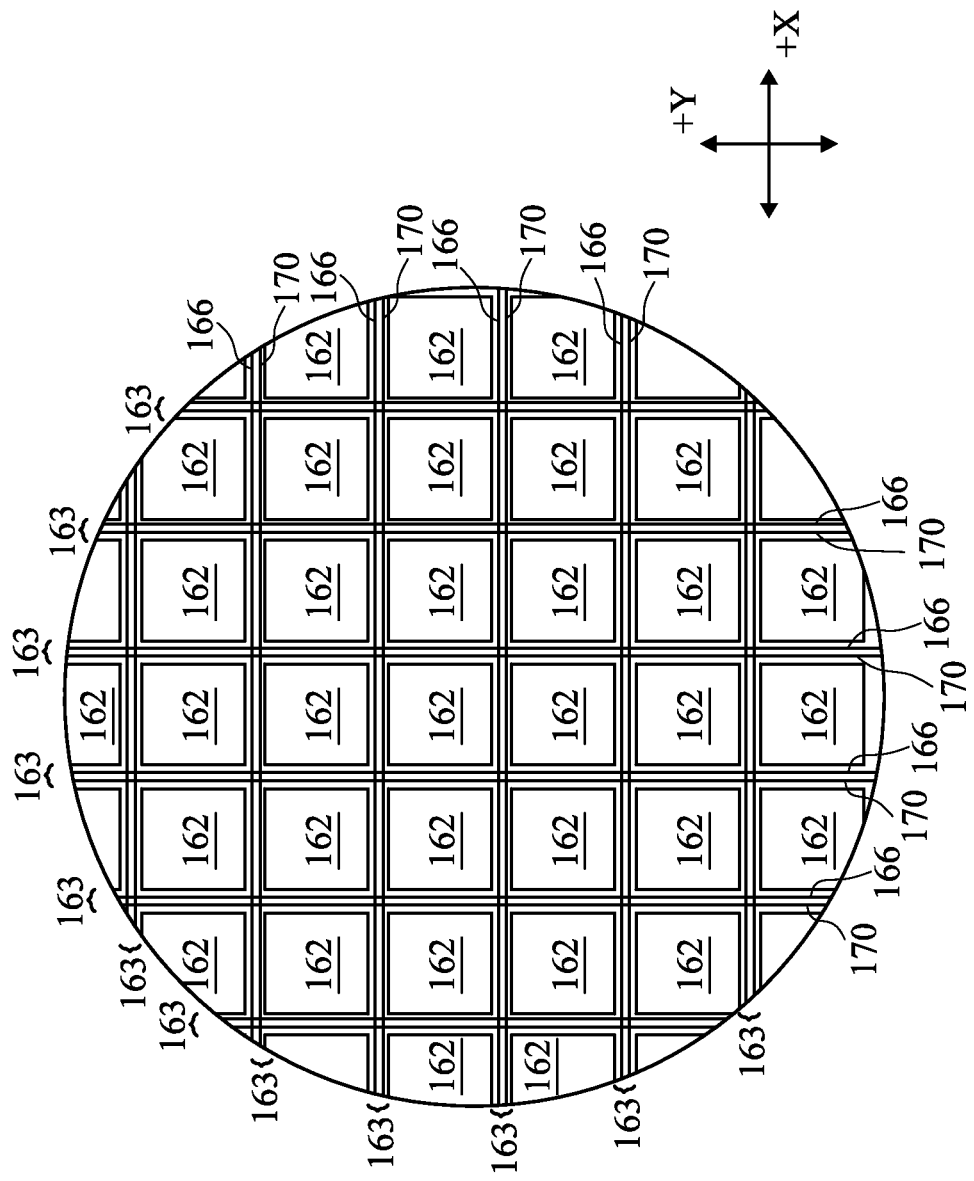

Referring to FIG. 14, a second die-saw is performed, resulting in trench 170 (FIG. 15A). The respective step is also shown as step 220 in the process flow shown in FIG. 23. The second die-saw is also performed using a relatively thin blade, for example, the same blade 164 used for the first die-saw. The second die-saw is also performed on the same scribe line 163 on which the first die-saw is performed. Furthermore, the first die-saw and the second die-saw may be performed on the opposite sides of middle line 168. The first die-saw and the second die-saw may be mirrored symmetrical to middle line 168. For example, the depth of the trench 170 (FIG. 15A) generated by the second die-saw may be the same as depth D1 of trench 166.

FIGS. 15A and 15B illustrate the cross-sectional view and the top view, respectively, of a part of wafer-level package 62 after two die-saws have been performed on each of scribe lines 163. As shown in FIG. 15A, the portion of dielectric layers 56 between trenches 166 and 170 is fully separated from the portions of the dielectric layers 56 in packages 162. Referring to FIG. 15B, for wafer-level package 62, a plurality of die-saws (each being similar to the first or second die-saws) is performed. Each of the horizontal scribe lines 163 (extending in X direction) is sawed twice, and each of vertical scribe lines 163 (extending in Y direction) is also sawed twice.

Figure 16:
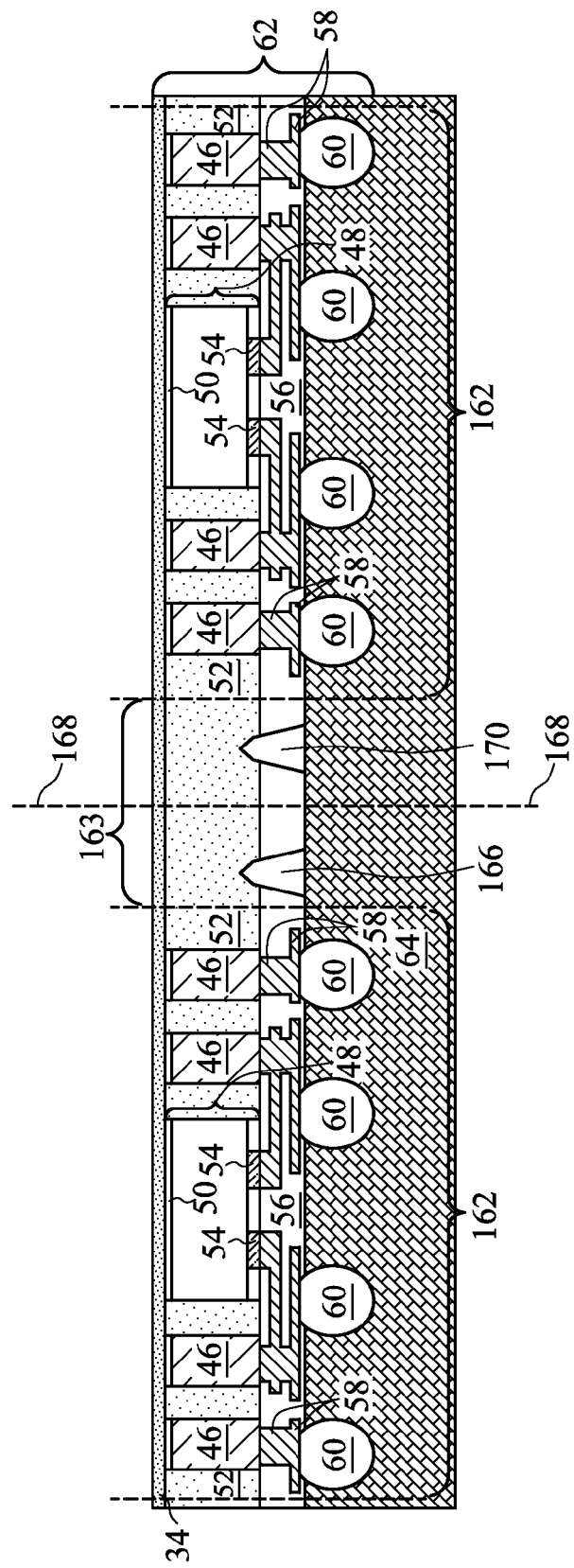

Next, package 62 is de-bonded from carrier 30 (FIG. 15A). In accordance with some exemplary de-bonding process, dicing tape 64 (FIG. 16) is attached to package 62 to protect electrical connectors 60, wherein dicing tape 64 is fixed to a dicing frame (not shown). The respective step is shown as step 222 in the process flow shown in FIG. 23. The de-bonding is performed, for example, by projecting a UV light or a laser on adhesive layer 32 (FIG. 15A). For example, when adhesive layer 32 is formed of LTHC, the heat generated from the light or laser causes the LTHC to be decomposed, and hence carrier 30 is detached from wafer-level package 62. The resulting structure is shown in FIG. 16.

Figure 17:
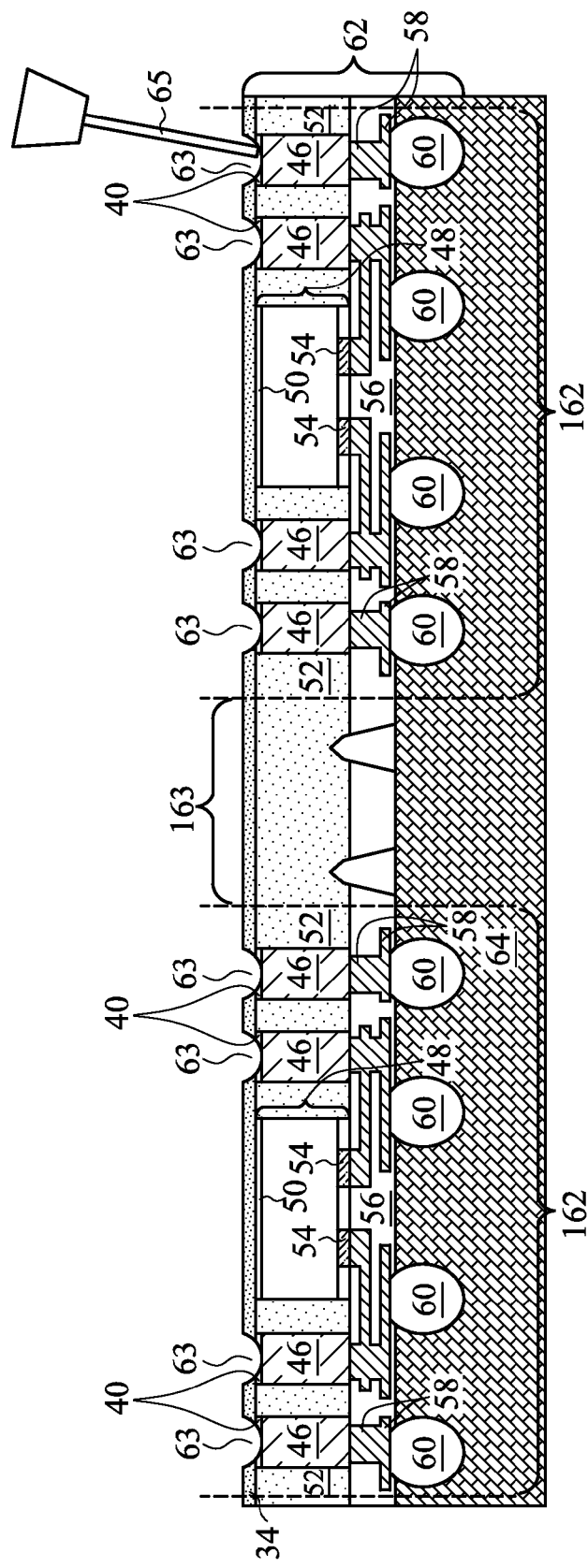

FIG. 17 illustrates the patterning for forming openings 63 in dielectric layer 34. The respective step is shown as step 224 in the process flow shown in FIG. 23. For example, when dielectric layer 34 is a polymer layer, it can be patterned using laser drill (through laser beam 65) to remove the portions overlapping through-vias 46, so that through-vias 46 are exposed through openings 63.

In the embodiments in which a portion of conductive seed layer 40 is formed of titanium, the titanium layer of conductive seed layer 40 may also be removed. For example, Hydrogen Fluoride (HF) gas or a diluted HF solution may be used to etch titanium. The copper in conductive seed layer 40 is exposed, and hence the subsequently formed backside RDLs or electrical connectors such as solder regions may be formed thereon.

In accordance with some embodiments of the present disclosure, no solder regions are formed on the backside of package 62 at this time (before die saw). Furthermore, there is no backside RDL formed. In accordance with alternative embodiments of the present disclosure, backside RDLs (not shown) and/or the electrical connectors are formed on the backsides (the illustrated top side in FIG. 15A) of device dies 48, with the backside RDLs electrically coupled to through-vias 46. In accordance with some exemplary embodiments of the present disclosure, there is a single backside RDL layer. In accordance with some embodiments, there is a plurality of RDL layers, wherein vias are formed to interconnect the different metal traces in different RDL layers. The backside dielectric layers may also be formed of a polymer such as PBO, BCB, polyimide, or an inorganic material such as silicon oxide, silicon nitride, silicon oxynitride, or the like. Electrical connectors such as solder regions, metal pillars with solder caps, or the like may be formed.

Figure 18A:
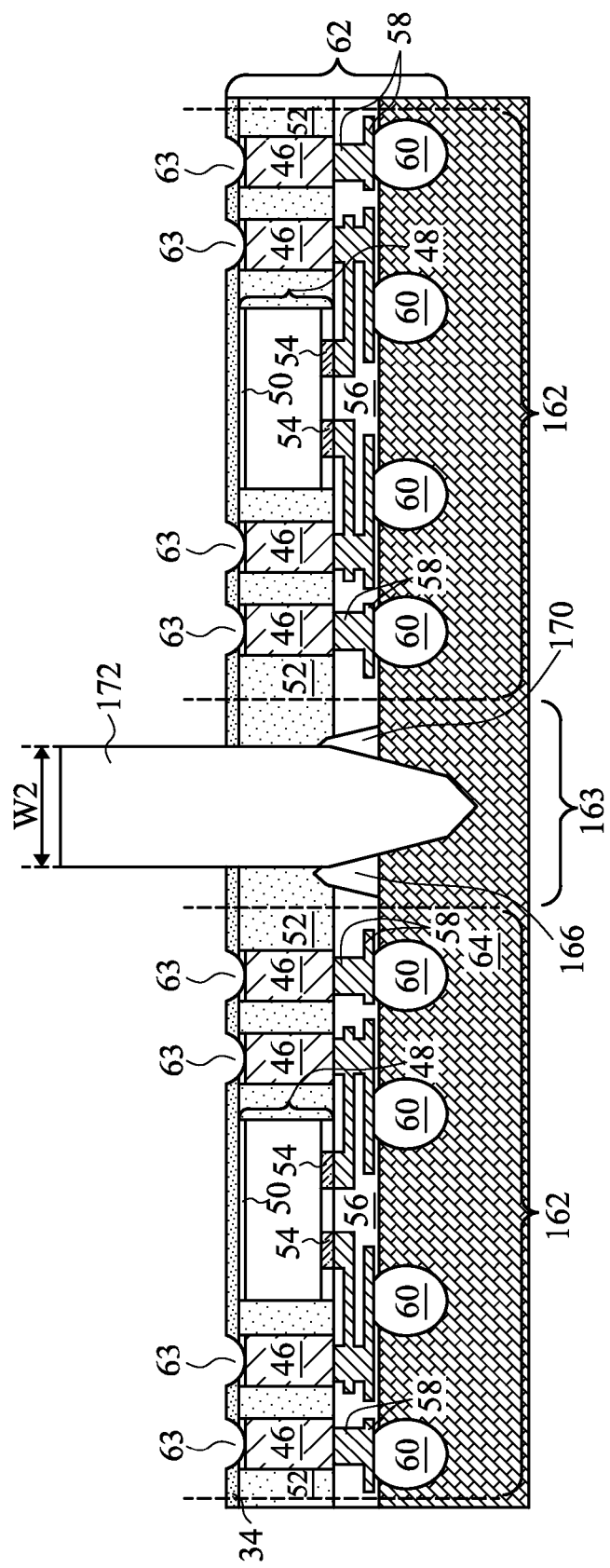

In subsequent steps, as shown in FIG. 18A, package 62 is sawed apart into a plurality of packages 162, each including (at least) one of device dies 48 and the corresponding through-vias 46. The respective step is shown as step 226 in the process flow shown in FIG. 23. A third die-saw is performed, as shown in FIG. 18A, for example, using blade 172. The third die-saw is performed from an opposite side of wafer-level package 62 than the first and the second die-saws. Blade 172 is wider than blade 164 used in the first and the second die-saws (as shown in FIGS. 13 and 14). Width W2 of blade 172 may be in the range between about 180 µm and about 220 µm. In accordance with some embodiments, ratio W2/W1 is greater than 2, and may be greater than 3 or 4. Since the blade of the third die-saw is wider than the first and the second die-saws, the trench generated by the third die-saw are also wider than the trenches generated by the first and the second die-saws. After the third die-saw, the packages 162 on the left side of the illustrated scribe line 163 are fully separated from the packages 162 on the right side of the illustrated scribe line 163. The third die-sawing may be aligned to middle line 168 of scribe line 163.

A plurality of die-saws similar to the third die-saw as shown in FIG. 18A is performed on wafer-level package 62, with each of the die-saws performed on one of the scribe lines 163 (FIG. 15B), so that wafer-level package 62 is separated into a plurality of packages 162.

Figure 18B:
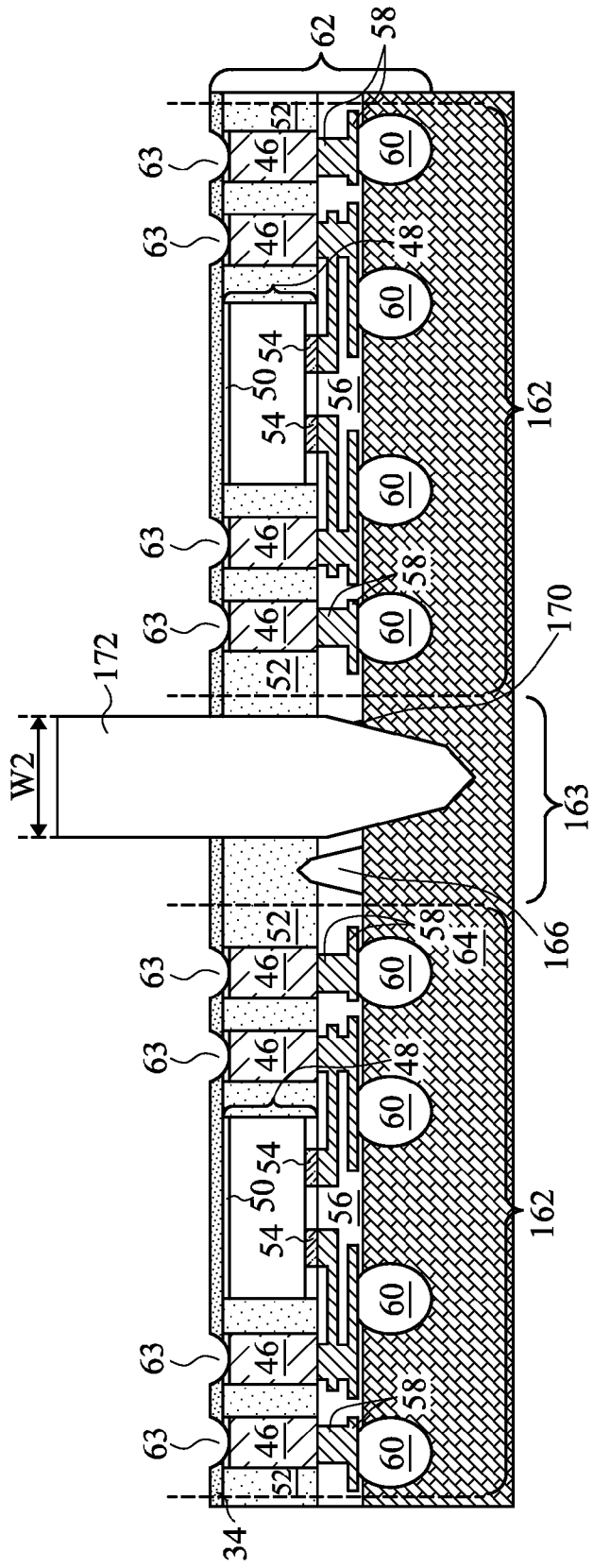

FIG. 18B illustrates a scenario that the third die-saw is misaligned from the center of scribe line 163. Accordingly, a portion of the remaining portion of dielectric layers 56 may remain after the third-die saw.

Figure 19:
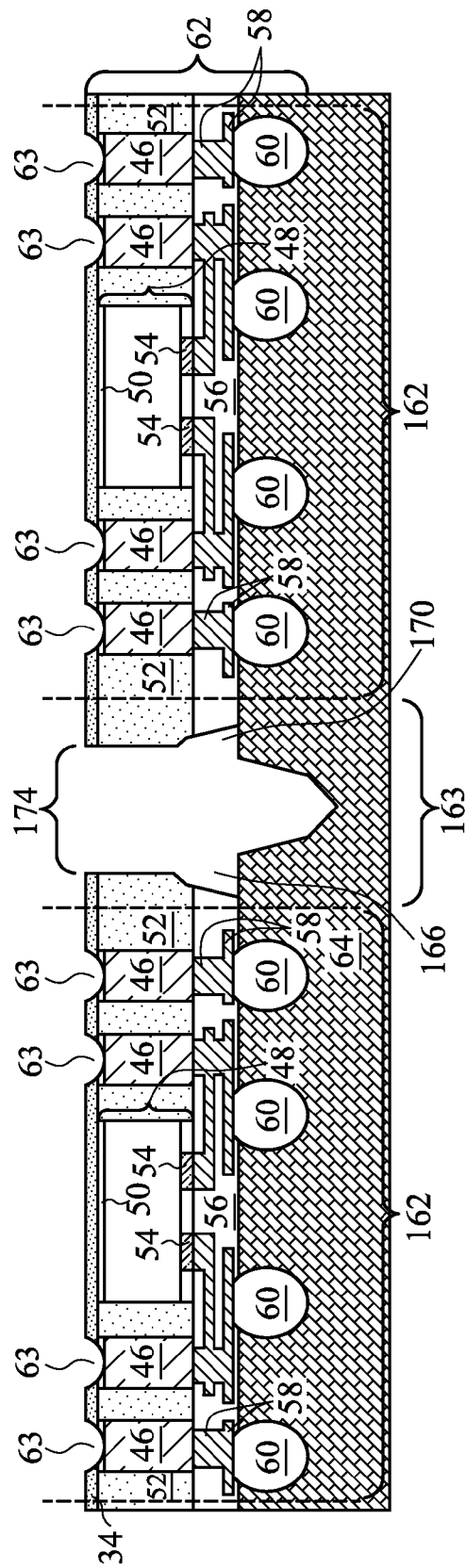

FIG. 19 illustrates the resulting wafer-level package 62 after the third die-saw, which generates trench 174. Trench 174 is joined to trenches 166 and 170. Advantageously, since the (center) part of dielectric layers 56 in the center region of scribe line 163 is already separated from the parts of dielectric layers 56 in packages 162, even if the center part of dielectric layers 56 peels from encapsulating material 52 during the third die-saw, the peeling will be stopped when reaching trenches 166 and 170, and hence there will be no die-saw-incurred peeling propagated into packages 162.

Figure 20:
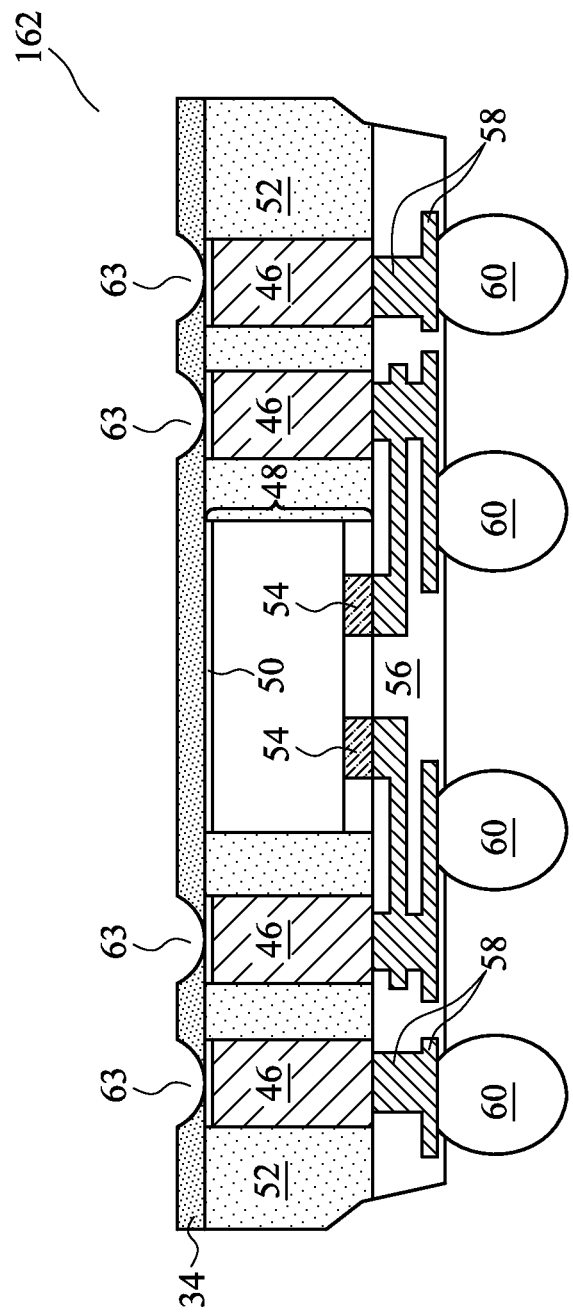
Figure 21A:
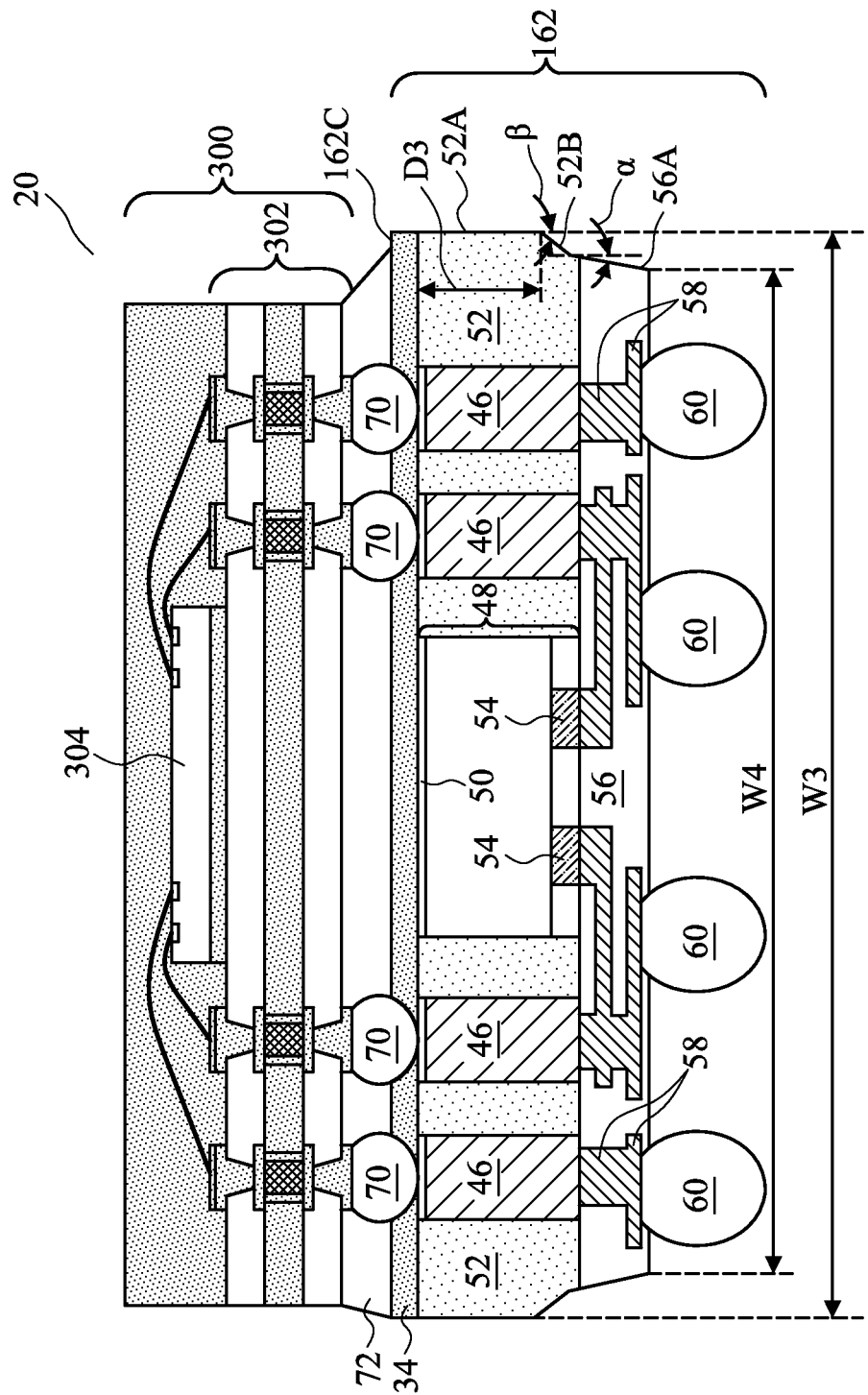

FIG. 20 illustrates a cross-sectional view of package 162. FIG. 21A illustrates the bonding of package 300 to package 162, thus forming PoP package 20. The respective step is shown as step 228 in the process flow shown in FIG. 23. Packages 300 and 162 are also referred to as a top package and a bottom package, respectively, of the PoP package 20. In the exemplary embodiments as shown in FIG. 21A, no backside RDL is illustrated, while the backside RDLs may be formed in accordance with alternative embodiments. The bonding is performed through solder regions 70, which join through-vias 46 to the metal pads in the overlying package 300. In accordance with some embodiments of the present disclosure, package 300 includes device die(s) 304, which may be memory dies such as Static Random Access Memory (SRAM) dies, Dynamic Random Access Memory (DRAM) dies, or the like. The memory dies may also be bonded to package substrate 302 in some exemplary embodiments. After the bonding of top package 300 to bottom package 162, underfill 72 is disposed into the gap between top package 300 and bottom package 162, and is then cured.

As shown in FIG. 21A, bottom package 162 includes encapsulating material 52, which has edge 52A. In accordance with some exemplary embodiments, edge 52A is a straight edge that is perpendicular to the major top surface 162C of package 162. Encapsulating material 52 may further include edge 52B, which is a slant edge neither perpendicular to nor parallel to the major top surface 162C of package 162. Straight edge 52A may have length D3 in the range between about 120 µm and about 220 µm. Length D3 is also the thickness of the portions of encapsulating material 52 overlapped by trenches 66 and 170 (FIG. 15A). Dielectric layers 56 have edges 52A, which may be a straight edge perpendicular to major top surface 162C of package 162, or may be a slant edge neither perpendicular to nor parallel to the major top surface 162C of package 162. Edges 52A is connected to edge 56A through edge 52B to form a step (an up-side-down step in FIG. 21A). Package 162 has width W3 measured at a part (such as the top surface) of encapsulating material 52, and width W4 measured at the bottom surface of dielectric layers 56. Width W4 is greater than width W3. Furthermore, from the bottom end of straight edge 52A to the bottom end of edge 56A, the widths of package 162 may continuously and gradually reduce, resulting in a tapered package 162.

Further referring to FIG. 21A, in accordance with some embodiments of the present disclosure, edge 56A is a slant and straight edge having slant angle α, which may be in the range between, and including, 0 degrees and about 30 degrees. When slant angle α is 0 degrees, edge 56A is perpendicular to major surface 162C. Edge 52B of encapsulating material 52 is a slant edge, which may be a straight edge having slant angle β in the range between, and including, about 30 degrees and about 60 degrees. Alternatively, edge 52B is a curved edge, with different portions of the curved edge having different slant angles ranging between about 30 degrees and about 60 degrees. In these embodiments, the upper portions the curved edge may have higher slant angles than lower portions, and from upper portions to lower portions, the slant angles may be continuously and gradually reduced. Edges 52A, 52B, and 56A are defined by the shapes of blades.

Figure 21B:
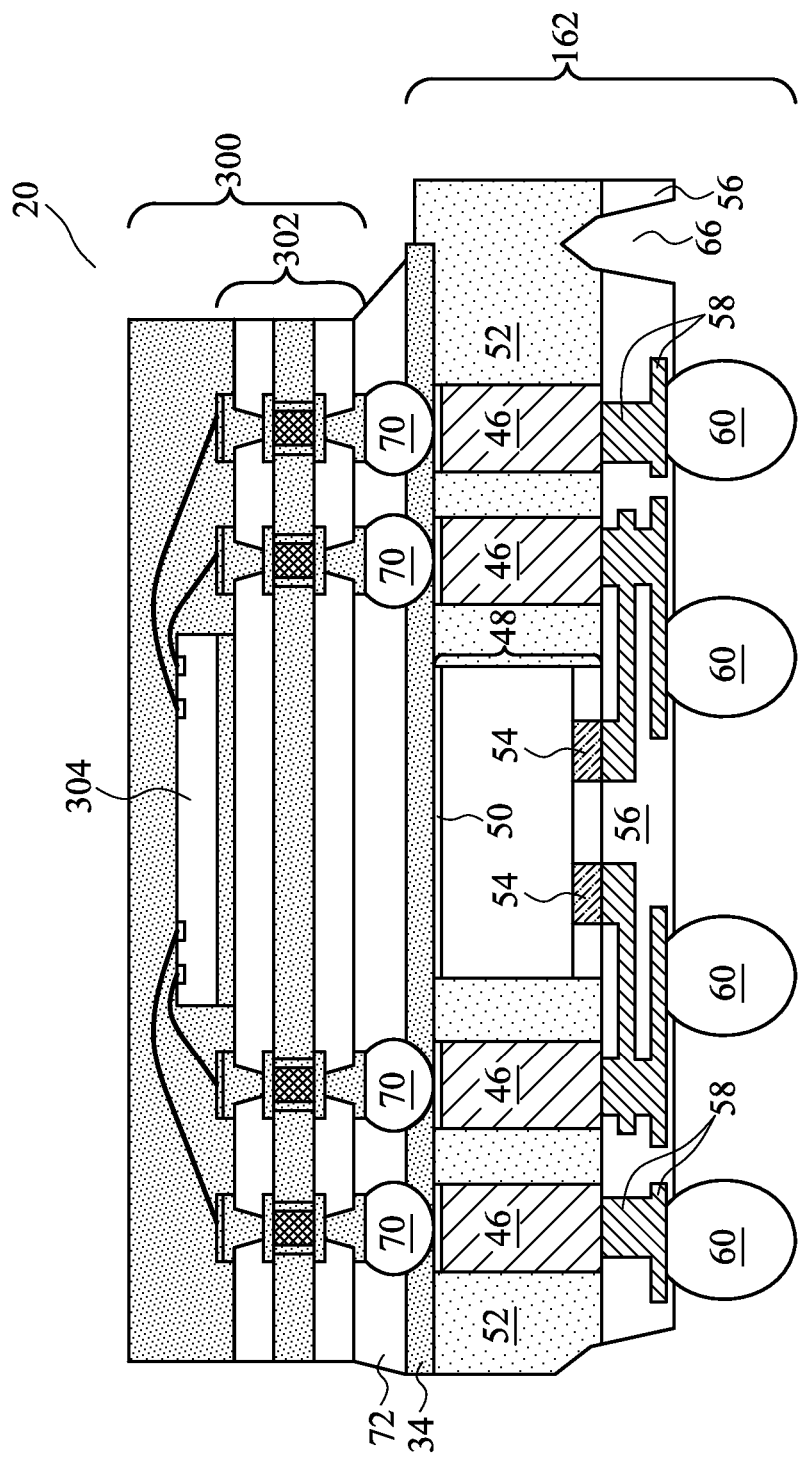

FIG. 21B illustrates the package 20 formed when the third die-saw is misaligned from the center of scribe line 163. Accordingly, a center portion of dielectric layers 56 between trenches 166 and 170 may remain on one of packages 162 after the third-die saw. The remaining portion of dielectric layers 56 is located between straight edge 52A and trench 66. When viewed from a bottom view of package 20, trench 66 is parallel to edge 52A. Furthermore, edge 52A in these embodiments may extend from the top surface all the way to the bottom surface of package 162. It is realized that each of the edges of package 162 may have the shape shown in FIG. 21A or 21B in any combination.

Figure 22:
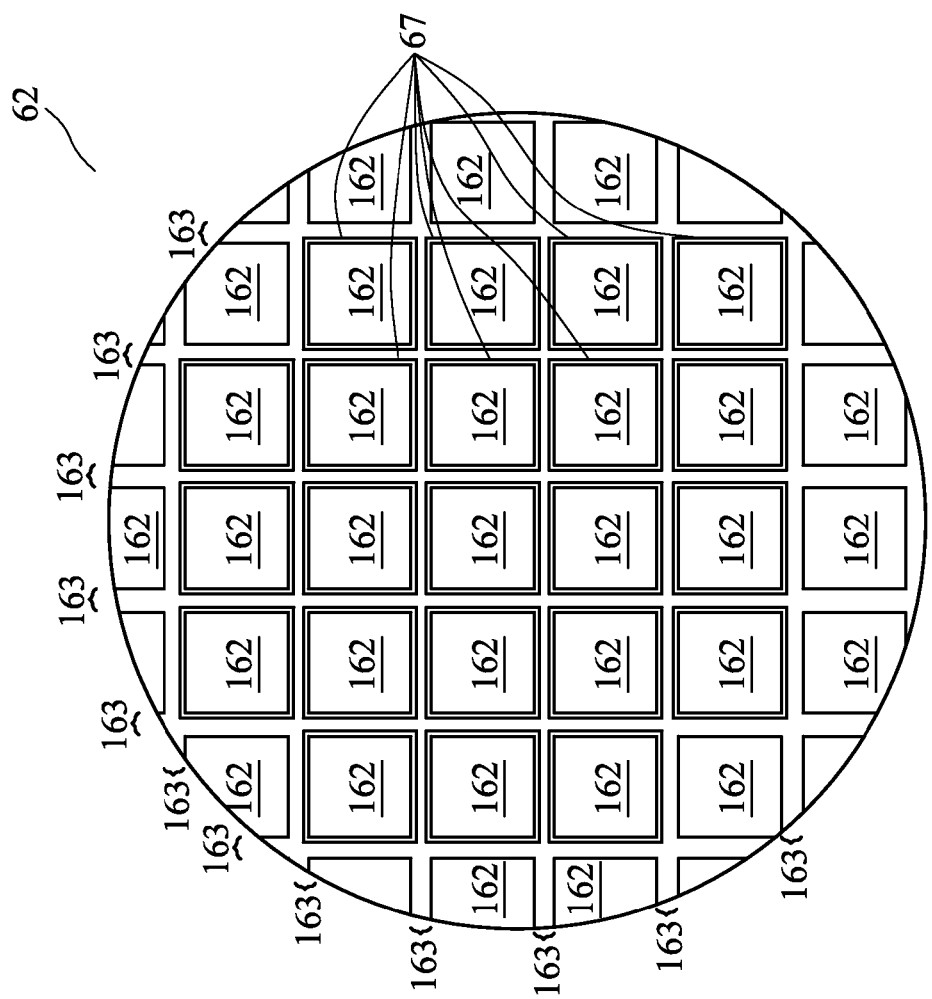
FIG. 22 illustrate the top view of a wafer-level package in a dicing step in accordance with some embodiments.

FIG. 22 illustrates trenches 67 formed in accordance with some embodiments, wherein the steps shown in FIGS. 13 and 14 are replaced with the formation of trenches 67. These embodiments are similar to the embodiments shown in FIGS. 13 and 14, except that narrow trenches 67 are formed to encircle packages 162. Trenches 67 may be formed using laser. After the formation of narrow trenches 67, the steps shown in FIGS. 16 through 21A/21B are performed. The resulting structure is similar to what is shown in FIGS. 21A and 21B. However, due to the use of laser, the edges of trenches 6 may be rough.

The embodiments of the present disclosure have some advantageous features. In conventional die-sawing process, a single wide blade is used. Accordingly, dielectric layers 56 (FIG. 19), which are formed of polymer, are prone to the peeling from the encapsulating material. In some embodiments of the present disclosure, the die-saw using thin blades significantly reduces the peeling. In the subsequent die-sawing using wide blades, the trenches formed using the thin blade block the peeling from propagating into the packages.

In accordance with some embodiments of the present disclosure, a method includes placing a first device die and a second device die over a carrier, with a scribe line between the first device die and the second device die. The first device die and the second device die are encapsulated with an encapsulating material, which has a portion in the scribe line. The method further includes forming a dielectric layer over the encapsulating material, performing a first die-saw to form a first trench in the scribe line, performing a second die-saw to form a second trench in the scribe line, and performing a third die-saw on the scribe line to separate the first device die from the second device die.

In accordance with some embodiments of the present disclosure, a method includes placing a first device die and a second device die over a carrier, with a scribe line between the first device die and the second device die. The first device die and the second device die are encapsulated with an encapsulating material, which has a portion in the scribe line. The method further includes forming a polymer layer over the encapsulating material, with the polymer layer having a portion in the scribe line, and performing a first die-saw to form a first trench in the scribe line. The first die-saw is performed using a first blade. A second die-saw is performed on the scribe line. The second die-saw is performed using a second blade wider than the first blade.

In accordance with some embodiments of the present disclosure, a package includes a device die, and an encapsulating material encircling the device die. The encapsulating material has a first edge substantially perpendicular to a major top surface of the encapsulating material. The package further includes a polymer layer having a second edge on a same side of the device die as the first edge. The second edge is recessed toward the device die from the first edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    placing a first device die and a second device die over a carrier, with a scribe line between the first device die and the second device die;
    encapsulating the first device die and the second device die with an encapsulating material, wherein the encapsulating material comprises a portion in the scribe line;
    forming a dielectric layer over the encapsulating material;
    performing a first die-saw to form a first trench in the scribe line;
    performing a second die-saw to form a second trench in the scribe line; and
    performing a third die-saw on the scribe line to separate the first device die from the second device die.

2. The method of claim 1, wherein the first trench and the second trench are spaced apart from each other, and the third die-saw is performed on a portion of the scribe line between the first trench and the second trench.

3. The method of claim 1, wherein the first die-saw and the second die-saw are performed using blades narrower than a blade used for the third die-saw.

4. The method of claim 1, wherein the first trench and the second trench penetrate through the dielectric layer and stop at an intermediate level of the encapsulating material.

5. The method of claim 1 further comprising de-bonding the first device die and the second device die from the carrier, wherein the first die-saw and the second die-saw are performed from an opposite direction the third die-saw is performed.

6. The method of claim 1, wherein a third trench formed by the third die-saw is joined to the first trench.

7. The method of claim 1, wherein the first die-saw and the second die-saw each is performed using a laser, and the third die-saw is performed using a blade.

8. A method comprising:
    placing a first device die and a second device die over a carrier, with a scribe line between the first device die and the second device die;
    encapsulating the first device die and the second device die with an encapsulating material, wherein the encapsulating material comprises a portion in the scribe line;
    forming a polymer layer over the encapsulating material, wherein the polymer layer comprises a portion in the scribe line;
    performing a first die-saw to form a first trench in the scribe line, wherein the first die-saw is performed using a first blade; and
    performing a second die-saw on the scribe line to form a second trench in the scribe line, wherein the second die-saw is performed using a second blade wider than the first blade.

9. The method of claim 8, wherein the first trench is spaced apart from the second trench, and the method further comprises performing a third die-saw to form a third trench between the first trench and the second trench.

10. The method of claim 9, wherein the third die-saw is performed using a blade narrower than the second blade.

11. The method of claim 9, wherein the third die-saw cuts into a portion of the scribe line between the first trench and the second trench.

12. The method of claim 8, wherein the second die-saw cuts into the first trench.

13. The method of claim 8, wherein the first device die, the second device die, the encapsulating material, and the polymer layer in combination form a wafer-level package, and the first die-saw and the second die-saw are performed from opposite sides of the wafer-level package.

14. The method of claim 8, wherein the first trench penetrates through all polymer layers overlying the encapsulating material and stops at an intermediate level of the encapsulating material, and the second die-saw penetrates through the encapsulating material and the all polymer layers overlying the encapsulating material.

15. A method comprising:
   encapsulating a first device die and a second device die in an encapsulating material;
   performing a first die-saw to form a first trench between the first device die and the second device die, wherein the first trench stops at an intermediate level between a top surface and a bottom surface of the encapsulating material; and
   performing a second die-saw to form a second trench between the first device die and the second device die, wherein the first die-saw and the second die-saw are performed from opposite sides of the encapsulating material, and the first trench is misaligned from the second trench as seen in a cross-sectional view.

16. The method of claim 15, wherein an edge portion of the first trench is joined to the second trench.

17. The method of claim 16, wherein the first trench has a portion outside of the second trench.

18. The method of claim 15, wherein the first die-saw is performed using a blade, and in a cross-sectional view of the blade passing through a center axis of the blade, the blade has a first portion with a curved edge, and a second portion having a straight edge connected to the curved edge, and wherein the first die-saw is performed with the curved edge extending into the encapsulating material, and the first die-saw is finished before the straight edge of the blade extends into the encapsulating material.

19. The method of claim 15 further comprising performing a third die-saw to form a third trench, wherein the first die-saw and the third die-saw are performed from a same side of the encapsulating material, and the second trench is in a middle of the first trench and the third trench.

20. The method of claim 15 further comprising:
   forming dielectric layers over the encapsulating material; and
   forming redistribution lines in the dielectric layers, wherein in the first die-saw, the dielectric layers are sawed through.

* * * * *